United States Patent [19]
Findeisen et al.

[11] 4,443,765
[45] Apr. 17, 1984

[54] DIGITAL MULTI-TAPPED DELAY LINE WITH AUTOMATIC TIME-DOMAIN PROGRAMMING

[75] Inventors: Allen G. Findeisen, Austin; Larry L. Mellenbruch, Del Valle; Wallace D. Lentz, Leander, all of Tex.

[73] Assignee: The United States of America as represented by the Secretary of the Navy, Washington, D.C.

[21] Appl. No.: 303,448

[22] Filed: Sep. 18, 1981

[51] Int. Cl.³ .................... H03K 5/159; H03K 5/14
[52] U.S. Cl. .................... 328/55; 328/119; 377/76; 377/81; 307/602
[58] Field of Search .............. 328/55, 119; 377/76, 377/73, 67, 77, 81; 307/602

[56] References Cited

U.S. PATENT DOCUMENTS

| | | | |
|---|---|---|---|
| 3,184,685 | 5/1965 | Funk et al. | 377/76 |
| 3,588,707 | 6/1971 | Manship | 328/55 |
| 3,675,049 | 7/1972 | Haven | 328/55 |
| 3,728,635 | 4/1973 | Eisenberg | 328/55 |
| 4,016,511 | 4/1977 | Ramsey et al. | 377/76 |

Primary Examiner—John S. Heyman
Assistant Examiner—Timothy P. Callahan

[57] ABSTRACT

A single-input, multiple-output device which enables an electrical signal to be automatically delayed in accordance with irregularly spaced synchronization pulses. The device employs a plurality of first-in, first-out (FIFO) shift registers energized in inverse order by the clocked outputs of a series of conventional shift registers. The signal to be delayed is stored in the FIFO registers and read out in accordance with the sequence of synchronization pulses provided to the conventional registers.

15 Claims, 4 Drawing Figures

4,443,765

DIGITAL MULTI-TAPPED DELAY LINE WITH AUTOMATIC TIME-DOMAIN PROGRAMMING

BACKGROUND OF THE INVENTION

The present invention relates generally to delay lines and more particularly to variable delay lines.

In handling electrical signals it is occasionally useful to introduce delays. Such delays are particularly useful in sonar applications.

Variable delay lines are known having taps which divide the line into a plurality of delay segments whose delay values are fixed. A sample of a waveform applied to the input of the line will be received at any tap after a delay equal to the sum of the delays introduced by the intervening delay segments. Examples of such delay lines include shift registers wherein outputs may also be tapped off at intermediate stages.

Variable delay lines are also known having a line length which can be varied. A sample of a waveform applied to the input of the line will be received at the output after a delay equal to the delay introduced by the intervening length of line. An example of such a line is the variable-length shift-register integrated circuit, such as the Motorola MC 14557, wherein the desired register length (number of bits) and therefore time delay (for a given clock rate) is programmed by supplying to the register a digital code word representing the delay.

A need exists for a variable delay line having multiple taps as well as intervening segments whose delay values can be varied under control of an external circuit. Such a delay line might be constructed from the above-mentioned variable delay lines but would require extremely complicated switching or encoding circuitry.

OBJECTS OF THE INVENTION

Accordingly, it is an object of the present invention to provide an improved variable delay line.

It is another object of the present invention to provide a variable delay line having multiple taps and intervening segments whose delay values can be varied under control of an external circuit.

It is a further object of the present invention to provide a variable delay line which does not require extremely complicated switching or encoding circuitry for its implementation.

SUMMARY OF THE INVENTION

The objects of the present invention are achieved by a variable delay line including a plurality of cascaded delay sections and circuitry for programming delays into the delay sections, and by a method for programming the delays. Each of the delay sections includes a first-in first-out shift register having a shift-in clock input and a shift-out clock input. The programming circuitry includes a store having a plurality of elements for storing data and for advancing data therethrough, and a source of a sequence of timing pulses for supply to the store to clock the advancement of data. The programming circuitry further includes gating circuitry responsive to the advancement of data to the output of one of the elements of the store for passing fixed frequency clock pulses to the shift-in clock input of one first-in first-out register and to the shift-out clock input of another first-in first-out register. The spacing between the timing pulses from the source determines the programmed delays. The various delays are in effect programmed by supplying a single timing signal with the correct delay times between pulses. This greatly reduces the amount of programming circuitry required.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE PREFERRED EMBODIMENT

Figure 1:
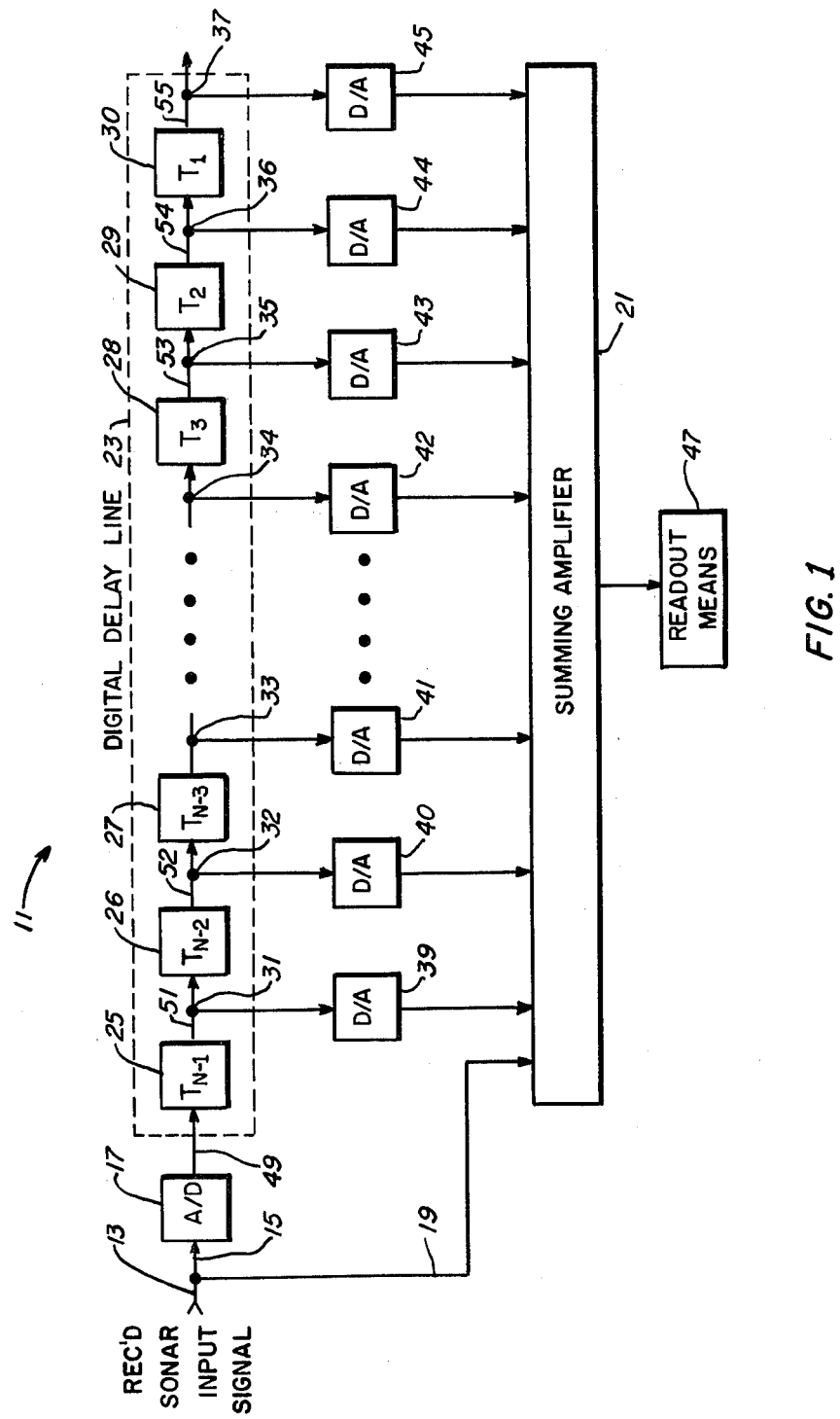
FIG. 1 is a schematic diagram of a signal processor in which the variable delay line of the present invention can be incorporated.

Referring now to the drawings, wherein like reference numerals designate identical or corresponding parts and more particularly to FIG. 1 thereof, there is illustrated a signal processor, generally indicated at 11. The signal processor is shown, by way of example only, since it is to be understood that the novel variable delay line of the present invention is applicable to all types of electronic signal processors. Signal processor 11 is utilized for summing the amplitudes of the echos produced by a transmitted sequence of sonar pulses.

As FIG. 1 shows, the echo signal is fed as an input on line 13 to the signal processor 11, to an analog-to-digital converter 17 on line 15 and to a summing amplifier 21 on line 19. The output of the analog-to-digital converter 17 is supplied to digital delay line 23 which includes (N-1) cascaded delay sections, each having its respective output tap 31–37. For clarity, only the first three delay sections 25–27 and the last three delay sections 28–30 are shown. Each delay section 25–30 is programmed to introduce a delay equal to the time interval between a pair of transmitted pulses. The programming circuitry is omitted from this figure. Specifically, if the delay sections are numbered N-1, N-2, N-3, ... 3, 2, 1 in descending order from the data input, then the delay section numbered n where n is an integer in the range 1 to N-1 is programmed for a delay time, $T_n$, that is, a delay equal to the time interval between the nth and the (n+1)th echo. Taps 31–37 feed respective digital-to-analog converters 39–45 whose outputs are connected, along with input signal on line 19, to the summing amplifier 21. The analog output of the summing amplifier is fed to readout means 47.

In operation, the echo signal is fed without delay to the summing amplifier 21 on line 19 while also being digitized in the analog-to-digital converter 17. The digitized counterpart of the echo signal is then fed to the variable delay line 23. Let it be assumed that the echo signal has passed down the delay line and that the last echo has just arrived on line 13. At this time each of the delay sections will be generating a replica of one of the earlier echos in the sequence according to the cumulative delay introduced by the delay sections intervening between it and line 13. Thus, the delay section 30 numbered "1" will generate a replica of the first echo. The delay section numbered "2" will generate a replica of the second echo, etc. The echo replicas appearing at the taps 31–37 are instantly converted back to analog pulses in the digital-to-analog converters 39–45 and fed to the summing amplifier 21. the last echo is also fed to the summing amplifier 21 via line 19. The summing amplifier 21 sums the echo amplitudes and feeds the sum to readout means 47.

Figure 2:
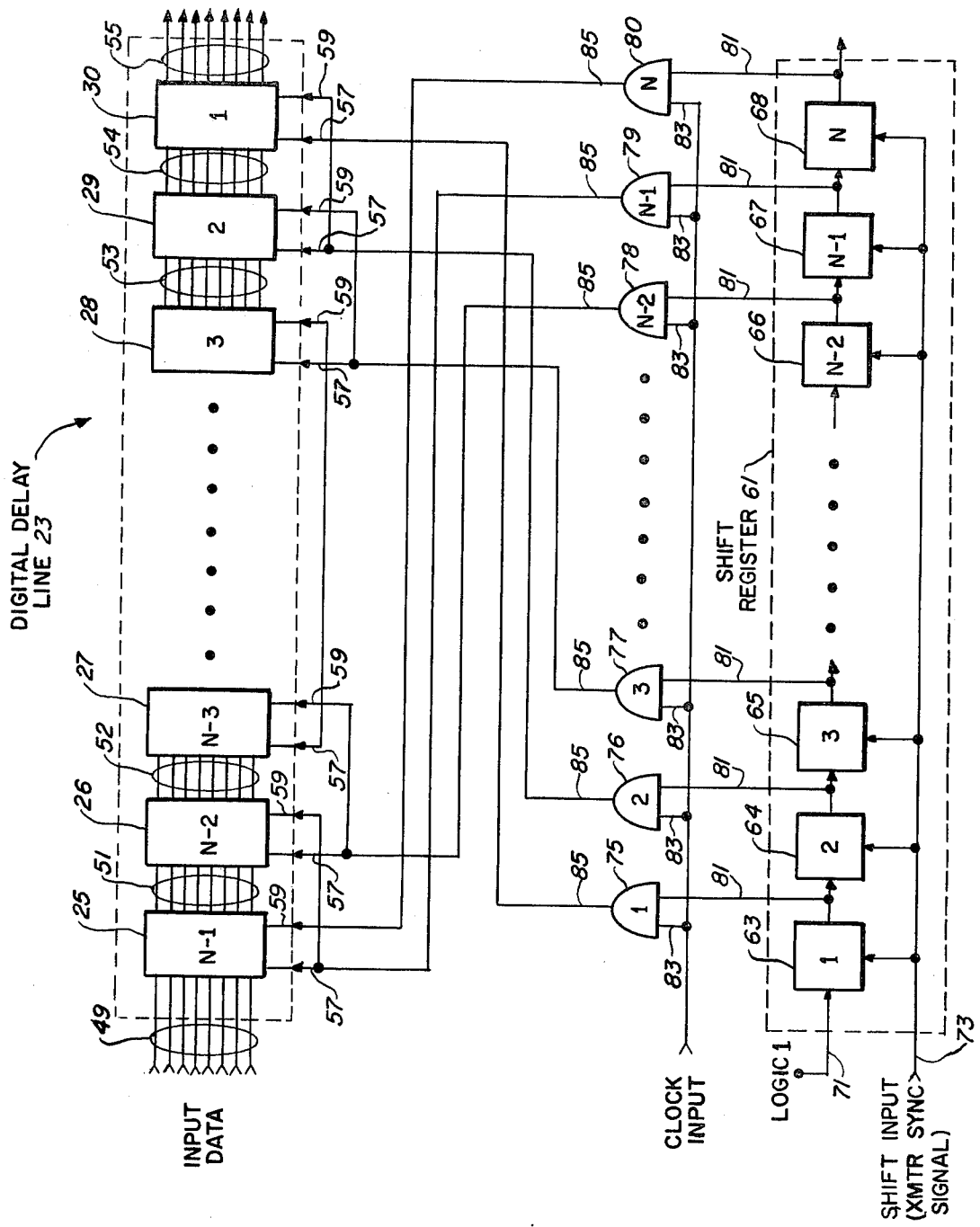
FIG. 2 is a schematic diagram of an embodiment of a variable delay line according to the present invention.

FIG. 2 is a circuit diagram of the novel variable delay line 23 of the present invention which can be incorporated in the signal processor 11 of FIG. 1. For a transmitted signal of N pulses, the variable delay line is seen to include (N-1) cascaded delay sections represented by blocks 25–30. For clarity, only the first three delay sections 25–27 and the last three delay sections 28–30 are shown. FIFO (first-in first-out) registers are used in preference to any other form of delay section. Suitable integrated-circuit FIFO registers can be purchased, for example, from the Fairchild Corporation, California, under the designation type 3341. These devices are 64-stage X 4-bit registers with provision for paralleling for additional word length (8-bit, 12-bit, etc.) and cascading (e.g., 128-stage). Each FIFO stage, in effect, consists of 192 stages so that delayed replicas of a signal applied to the data input 49 are provided at the outputs 51–55 of succeeding FIFO registers, the delay in each FIFO stage corresponding to the time period between the application of the first clocking pulse applied at the input clock terminal of the stage and the first clocking pulse applied at the output clock terminal of the stage. Thus, for stage 1 (30) of the FIFO register, the delay for the waveforms shown in FIG. 3 would be $T_1$ and would be determined by the time delay between the start of the clocking signals on lines (i) and (j).

The operation of the FIFO register as a delay line can be understood from the following discussion. Each FIFO register is provided with a shift-in clock input 57 and a shift-out clock input 59. In a conventional shift register, data are clocked into an input stage and remain there until additional data are entered which, in effect, force the earlier data down the line until they reach the output (the last stage) of the device. On the other hand, when data are clocked into the input stage of a previously empty FIFO register by applying a clock pulse to the shift-in clock input, they automatically move down the line to the output where they remain until clocked out by applying another clock pulse to the shift-out clock input. Thus, the input and output clocks are independent of one another. If a first source of clock pulses of frequency $f_c$ is applied to the shift-in clock input of the FIFO register and, K clock pulses later, a second source of clock pulses at the identical frequency $f_c$ is applied to the shift-out clock input of the FIFO, after the initial setup time the FIFO register will act like a K-bit shift register providing a fixed delay of $K/f_c$. (It should be noted that the first actual data enters the delay line on the first clock pulse following the N-1 st transmit sync pulse (until then the "data" is meaningless). The delay line will not be full and all outputs valid until the first input data propagates to the output of the last stage, a total delay of $T_1+T_2+\ldots+T_N$ after the N-1st sync pulse).

The circuitry for programming into the delay sections fixed delay values substantially equal to the irregularly spaced time intervals separating the echos in the echo signal will now be described.

The programming circuitry includes means having N elements for storing data and for advancing data therethrough. While such means may take a variety of forms, it may take the form, illustrated in FIG. 2, of an N-stage single-bit, parallel output shift register 61 of any conventional construction. Let it be assumed for the purpose of later discussion that the stages 63–68 of the shift register 61 are numbered 1, 2, 3, ..., N-2, N-1, N in ascending order from the data input 71. As shown, a logic 1 signal is placed at the data input 71 of the shift register 61 and the shift input 73 is triggered with the transmit sync signal from the sonar, whereby the advancement of the logic 1 signal through the N stages of the shift register is clocked by the pseudorandomly spaced sync pulses appearing at the shift input.

Means is also provided that is responsive to the advancement of data to the output of one of the elements of the storing means for passing fixed-frequency clock pulses to the shift-in clock input of one FIFO register and to the shift-out clock input of another FIFO register. While such means may take a variety of forms, it may take the form illustrated of N, two-input, AND logic gates 75–80. Each AND gate has one input 81 connected to the output of a respective stage of the shift register 61 and the other input 83 connected to a source of fixed-frequency clock pulses. Let it be assumed that the FIFO registers are numbered N-1, N-2, N-3, ... 3, 2, 1 in descending order from front (data input 49) to back (output 55). The output 85 of each AND gate except the last (the gate connected to the last stage of the shift register 61) is connected to the shift-in clock input 57 of the FIFO register whose number is the same as that stage of the shift register to which the gate is connected. The output of each AND gate except the first (the gate connected to the first stage of the shift register 61) is also connected to the shift-out clock input 59 of the FIFO register whose number is one less than the number of the stage of the shift register to which the gate is connected. Thus, for example, AND gate 76 has one input 83 connected to the source of fixed-frequency clock pulses and the other input 81 connected to the output of the second stage 64 of the shift register 61. The output of the AND gate 76 is connected to the shift-in clock input 57 of the FIFO register 29 numbered "2" and to the shift-out clock input 59 of the FIFO register 30 numbered "1".

Figure 3:
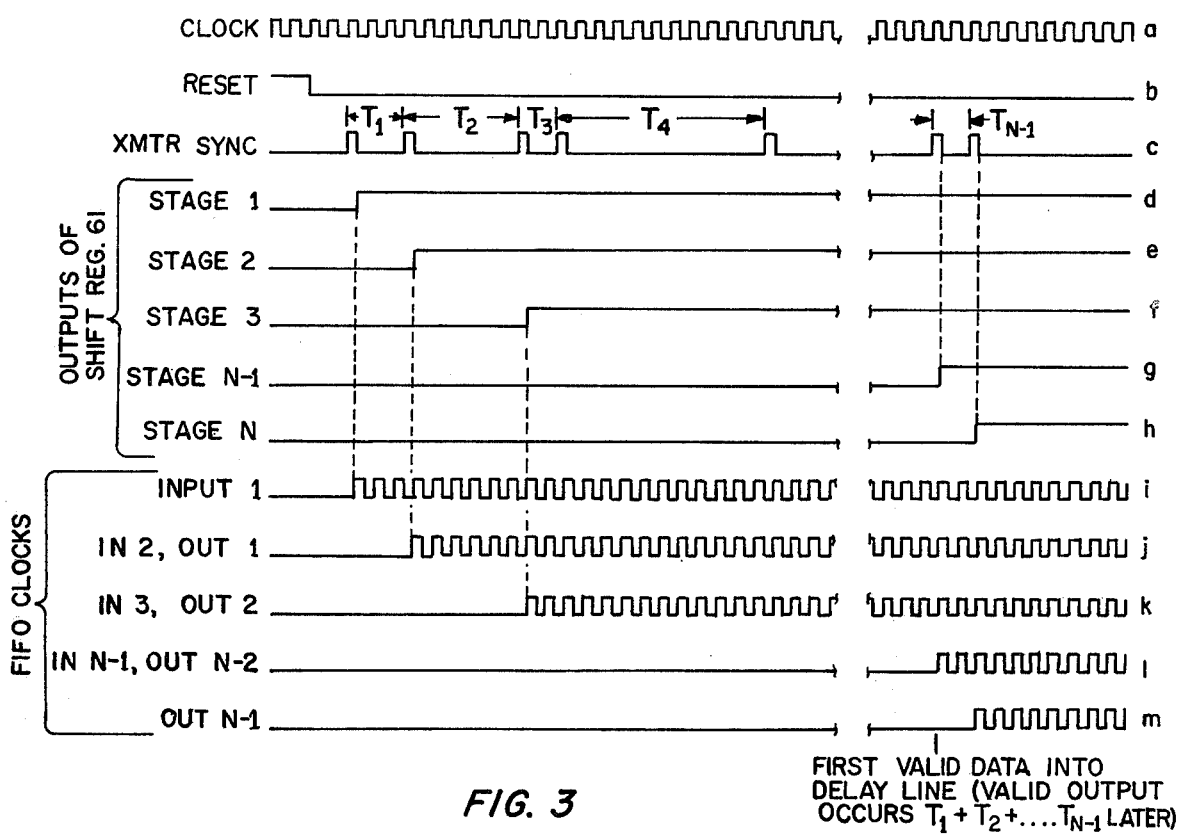
FIG. 3 is a graphic representation of waveforms useful in explaining the operation of the signal processor of FIG. 1.

In operation, just prior to transmitting a sequence of sonar pulses, all of the FIFO registers 25–30 and the shift register 61 are reset to zero (see FIG. 3, line b). When the first pulse in the transmit signal occurs (FIG. 3, line c), the first sync pulse is fed to the shift input 73 of the shift register 61 and advances the logic 1 at the data input 71 of the shift register to the output of the first stage 63 of the shift register. This enables the first AND gate 75 to pass the fixed-frequency clock pulses (FIG. 3, line a) to the shift-in clock input of the FIFO register 30 (numbered "1"). When the second pulse in the transmit signal occurs at time $T_1$ later, the second sync pulse is fed to the shift input 73 of the shift register 61 and advances the logic 1 at the output of the first stage 63 to the output of the second stage 64. The sync pulse also advances the logic 1 at the data input 71 of the shift register 61 to the output of the first stage 63 to maintain the passage of clock pulses to the shift-in clock input of the FIFO register 30. The logic 1 at the output of the second stage enables the second AND gate 76 which passes the fixed-frequency clock pulses to the shift-out clock input of the FIFO register 30 and also to the shift-in clock input of the FIFO register 29 numbered "2". The FIFO register 30 is thus programmed to have a delay equal to the number of clock periods between the occurrence of the first and second sync pulses. Since the sync pulses control the timing of the received echos, the FIFO register 30 is also programmed for a delay equal to the number of clock periods between the occurrence of the first and second echos, that is, for a delay of approximately $T_1$. Similarly, when the third pulse in the transmit signal occurs at time $T_2$ later, the third sync pulse starts the shift-out clock of the FIFO register 29 numbered "2", fixing its delay equal to the number of clock periods between the second and third echos, that is, a delay of approximately $T_2$. The process continues until the last sync pulse starts the shift-out clock of the FIFO register 25 numbered "N-1", thus completing the programming of the delay sections 25-30.

FIG. 3 shows the waveforms at different points in the circuit of FIG. 2 and their time relationships. The clock frequency (a) is shown considerably smaller than it actually is in practice.

Figure 4:
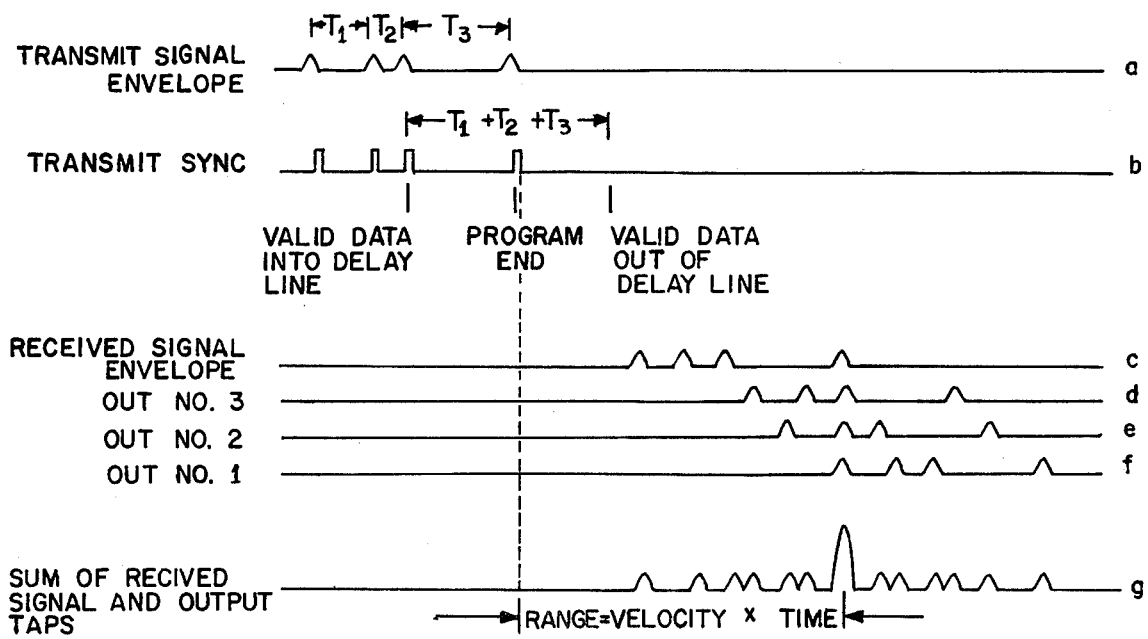
FIG. 4 is a set of waveforms for an exemplary four-pulse transmitted signal and a 3-stage delay line.

FIG. 4 shows waveforms for a three-stage delay line having a four-pulse transmit signal. It indicates the timing of the pulses in the transmit signal (a) and the transmit sync signal (b) which are synchronized with each other, the received signal envelope (c), the displacements of the delayed outputs (d, e and f) of the FIFO register stages 3, 2 and 1 and, finally, the summation (g) of the delayed outputs showing how the range of a target is determined. The time corresponding to the range is measured from the last transmitted pulse to the indicated maximum output. The signal pulses add together while any noise outputs typically would not.

Line (c), FIG. 3, illustrates a transmit sync signal produced by the transmitter of a sonar system, for example. The sync signal includes a sequence of N timing pulses generated at pseudorandomly spaced time intervals denoted by $T_1, T_2, \ldots T_{N-2}, T_{N-1}$, where N, for example may be 128. $T_1$ denotes the time period between the first and second sync pulses; $T_2$ the period between the second and third sync pulses, etc. The transmit sync signal also controls the timing of the transmitted sequence of sonar pulses that comprise the transmit signal (FIG. 4(a); note that FIGS. 3 and 4 do not show the same transmit and sync signals, however). Lines (c), (d), (e) and (f) of FIG. 4 show an exemplary sequence of sonar echos received by the sonar system and propagating through the delay line. There is a sequence here of four echoes, each corresponding to a respective pulse of the transmit signal. It will be appreciated that the transmitter sync pulses control the timing of the transmitted pulses and thus the received echoes.

Therefore, it is apparent that there has been provided an improved delay line having multiple taps and intervening segments whose delay values can be varied under control of an external circuit. The various delays are programmed by supplying a sequence of timing pulses with the correct delay times between pulses. This greatly reduces the amount of programming circuitry required.

Obviously many modifications and variations of the present invention are possible in light of the above teachings. Thus, for example, the delay sections can be programmed from front to back instead of back to front. Also delays proportional to but greater than or smaller than the programming intervals can be obtained by using one clock frequency during the programming of the delay sections and changing to another clock frequency afterwards. It is therefore to be understood that within the scope of the appended claims the invention may be practiced otherwise than as specifically described.

What is claimed is:

1. A variable delay line comprising:
    a plurality of cascaded delay sections having a data input, each delay section including a first-in first-out register having a shift-in clock input and a shift-out clock input; and
    means for programming fixed delay values simultaneously into said shift-in and shift-out clock inputs of alternate delay sections in response to irregularly spaced input signals.

2. The delay line recited in claim 1 wherein said programming means includes:
    storing means having a plurality of elements for storing data and for advancing data therethrough, each element having an output; and
    means for supplying a sequence of timing pulses to said storing means to clock the advancement of data.

3. The delay line recited in claim 2 wherein said programming means includes:
    gate means responsive to the advancement of data to the output of one of the elements of said storing means for passing fixed frequency clock pulses to the shift-in clock input of one first-in first-out register and to the shift-out clock input of another first-in first-out register.

4. The delay line recited in claim 2 including:
    means for supplying to the data input of said plurality of delay sections a sequence of information pulses separated by irregularly spaced time intervals; and wherein the timing pulses are separated by the irregularly spaced time intervals and the delay values are substantially equal to the irregularly spaced time intervals.

5. The delay line recited in claim 2 wherein said storing means includes a multi-stage parallel-output shift register.

6. The delay line recited in claim 3 wherein said gate means includes:
    a plurality of logic gates each having an output and at least two inputs, one input of each logic gate connected to the one of the elements of the storing means and the output of the logic gate connected to the shift-in clock input of one first-in first-out register and to the shift-out clock input of the succeeding first-in first-out register; and
    means for connecting the other input of said logic gate to an external source of the clock pulses.

7. The delay line recited in claim 5 wherein each said logic gate includes an AND gate.

8. A method of programming delays into a plurality of cascaded delay sections, each delay section including a first-in first-out register having a shift-in clock input and a shift-out clock input, the method comprising:
    clocking the advancement of data in a store with a sequence of timing pulses;
    passing fixed-frequency clock pulses to the shift-in clock input of one of the first-in first-out registers in response to a first advancement of data;
    passing fixed-frequency clock pulses to the shift-out clock input of the one of the first-in first-out registers and to the shift-in clock input of another first-in first-out register in response to a second subsequent advancement of data, while continuing to pass the fixed-frequency clock pulses to the shift-in clock input of the one of the first-in first-out shift registers; and passing fixed-frequency clock pulses to the shift-out clock input of the other first-in first-out register in response to a third subsequent advancement of data, while continuing to pass the fixed-frequency clock pulses to the shift-in clock input of the other first-in first-out register and to the shift-in and shift-out clock inputs of the one first-in first-out register.

9. A delay line having programmable delay times comprising:

first delay means having a plurality of cascaded delay stages;

second delay means having a plurality of cascaded delay stages, to the input of each of which a sequence of timing signals is applied, the output at each stage being initiated by a different one of said timing signals, and the output of each stage initiating a series of clocking pulses;

means connecting each series of clocking pulses to the input of a different one of said stages of said first delay means, the sequence of connection of the outputs of said second delay means being in reverse order to the sequence of the stage in said first delay means, the delay through each stage of said first delay means depending on the period between the time at which clocking pulses start to be applied to it and the time at which clocking pulses start to be applied to its immediately preceding stage.

10. A delay line as in claim 9, wherein each stage of said first delay means has an output tap.

11. A delay line as in claim 10, wherein
each said stage in said first delay means is a FIFO register stage.

12. A delay line as in claim 11, wherein:
said second delay means comprises a conventional shift register having N stages,
said sequence of timing signals comprises a series of N pulse-like signals, and
said first delay means comprises (N-1) FIFO stages.

13. A delay line as in claim 12, wherein:
a logic 1 signal is applied to the input of the first stage of the second delay means and the sequence of timing signals is applied to all stages of the second delay means in parallel.

14. A delay line as in claim 13, wherein:
said connecting means comprises a set of N AND gates, a different one being connected to receive as an input the output of each stage of said second delay means.

15. A delay line as in claim 14, wherein:
a series of clocking signals is connected in parallel to the second input of each said AND gate.

* * * * *